United States Patent

Chang et al.

[11] Patent Number: 5,847,437
[45] Date of Patent: Dec. 8, 1998

[54] RARE-EARTH ELEMENT-DOPED III-V COMPOUND SEMICONDUCTOR SCHOTTKY DIODES AND DEVICE FORMED THEREBY

[75] Inventors: Liann-Be Chang, Ta Hsi Town; Hang-Thung Wang, Hsinchuang, both of Taiwan

[73] Assignee: National Science Council, Taipei, Taiwan

[21] Appl. No.: 780,088

[22] Filed: Dec. 23, 1996

[51] Int. Cl.[6] .......................... H01L 27/095; H01L 29/47; H01L 29/812
[52] U.S. Cl. ........................... 257/471; 257/472; 257/475
[58] Field of Search ................... 257/280, 281, 257/471, 472, 473, 475, 476

[56] References Cited

U.S. PATENT DOCUMENTS

| 5,087,956 | 2/1992 | Katano ..................................... 257/472 |
| 5,132,282 | 7/1992 | Nanman et al. ........................... 257/33 |
| 5,148,240 | 9/1992 | Ohtsuka et al. ......................... 257/472 |
| 5,517,054 | 5/1996 | Huang et al. ............................ 257/472 |

OTHER PUBLICATIONS

Sharma et al; "Effect of rare earth doping on electrical & photoelectrical properties . . . "; Synthetic Metals vol. 80 pp. 249–256; Jul. 15, 1996.

Primary Examiner—Wael Fahmy
Attorney, Agent, or Firm—Friedman Siegelbaum LLP

[57] ABSTRACT

A semiconductor device has an improved schottky barrier junction. The device includes: a substrate; an epitaxial layer covering the substrate and lightly doped with a dopant selected from a group consisting of a rare earth element and an oxide of a rare earth element; and a metal layer covering the epitaxial layer and forming said schottky barrier junction with said epitaxial layer.

14 Claims, 9 Drawing Sheets

| SAMPLES / METALS | #1 (Pr₂O₃ undoped) I-V MEASUREMENT n | #1 I-V Φ$_{I-v}$ | #1 C-V MEASUREMENT Φ$_{c-v}$ | #1 C-V Nd (cm⁻²) | #2 (Pr₂O₃ wt% 9.39*10⁻⁵) I-V n | #2 I-V Φ$_{I-v}$ | #2 C-V Φ$_{c-v}$ | #2 C-V Nd (cm⁻²) | #3 (Pr₂O₃ wt% 4.97*10⁻⁵) I-V n | #3 I-V Φ$_{I-v}$ | #3 C-V Φ$_{c-v}$ | #3 C-V Nd (cm⁻²) | #4 (Pr₂O₃ wt% 2.49*10⁻⁵) I-V n | #4 I-V Φ$_{I-v}$ | #4 C-V Φ$_{c-v}$ | #4 C-V Nd (cm⁻²) |
|---|---|---|---|---|---|---|---|---|---|---|---|---|---|---|---|---|
| Ni | ... | ... | 0.58 | 2.27*10⁺¹⁶ | 1.33 | 0.74 | 0.81 | 1.04*10⁺¹⁶ | 1.02 | 0.94 | 1.35 | 2.41*10⁺¹⁴ | 1.03 | 0.92 | 1.11 | 1.67*10⁺¹⁵ |
| Pt | ... | 0.43 | 0.56 | 2.04*10⁺¹⁶ | 1.34 | 0.72 | 0.8 | 0.98*10⁺¹⁶ | 1.01 | 0.95 | 1.36 | 9.15*10⁺¹⁴ | 1.02 | 0.93 | 1.21 | 2.32*10⁺¹⁵ |
| Au | ... | 0.47 | 0.51 | 1.77*10⁺¹⁶ | 1.31 | 0.75 | 0.81 | 1.20*10⁺¹⁶ | 1.02 | 0.96 | 1.31 | 1.31*10⁺¹⁴ | 1.01 | 0.94 | 1.27 | 4.30*10⁺¹⁵ |
| Ag | ... | 0.41 | 0.57 | 2.22*10⁺¹⁶ | 1.32 | 0.73 | 0.79 | 1.3*10⁺¹⁶ | 1.01 | 0.94 | 1.3 | 3.27*10⁺¹⁴ | 1.02 | 0.95 | 1.33 | 2.45*10⁺¹⁵ | n : IDEAL FACTOR
Φ$_{I-v}$ : SCHOTTKY BARRIER
Φ$_{c-v}$ : SCHOTTKY BARRIER
Nd (cm⁻²) : IMPURITY CONCENTRATION

Fig. 3

RARE-EARTH ELEMENT-DOPED III-V COMPOUND SEMICONDUCTOR SCHOTTKY DIODES AND DEVICE FORMED THEREBY

FIELD OF THE INVENTION

The present invention relates to a method for manufacturing a semiconductor having a schottky-barrier junction, and especially relates to a method for manufacturing a schottky diode having an increased schottky-barrier and a low reverse leakage current.

BACKGROUND OF THE INVENTION

Recently, the III–V compounds, such as GaAs, having larger bandgaps than that of Si, are used for fabricating schottky diodes. Such schottky diode structures having larger bandgaps and carrier mobilities are often applied in rectifiers or transistors used in high-speed communication systems.

FIGS. 1($a$) and 1($b$) illustrate structures of schottky diode structures, each of which includes a substrate 1, an epitaxial layer 2 and a metal layer 3. A schottky barrier is formed at the junction of the metal layer 3 and the epitaxial layer 2. In a schottky diode manufacturing process, the surface state, surface oxidation, concentrations of background impurities and the existence of defects of the epitaxial layer 2 will affect the potential barrier of the schottky barrier greatly. The schottky barrier pinning phenomena caused by the high surface state and concentration of the deep impurities will limit the potential barrier of the schottky barrier under some specified value, about 0.8 eV for GaAs, for example. Furthermore, the reverse breakdown voltage of a schottky is also affected by the background impurity concentration, while the reverse leakage current is determined by the conditions of the factors mentioned above. Accordingly, it is conceivable to lower the surface state density or the impurity concentration of the epitaxial layer for increasing the height of the schottky barrier and the reverse breakdown voltage and lowering the reverse leakage current.

SUMMARY OF THE INVENTION

An object of the present invention is to provide a method for manufacturing a semiconductor device having a schottky diode structure with higher schottky barrier and lower leakage current.

The other object of the present invention is to provide a schottky diode structure having higher schottky barrier and breakdown voltage, and lower reverse leakage current.

The present invention provides a semiconductor device having a schottky barrier junction, which includes: a substrate; an epitaxial layer covering the substrate and lightly doped with a dopant selected from a group consisting of a rare earth element and an oxide of a rare earth element; and a metal layer covering the epitaxial layer and forming the schottky barrier junction with the epitaxial layer.

In accordance with one aspect of the present invention, the substrate is preferably a n-type compound semiconductor substrate or a semi-insulating substrate.

In accordance with another aspect of the present invention, the epitaxial layer is preferably a gallium arsenide (GaAs) layer.

In accordance with another aspect of the present invention, the epitaxial layer is preferably an Indium phosphide (InP) layer.

In accordance with another aspect of the present invention, the epitaxy layer is preferably an n-type epitaxy layer.

In accordance with another aspect of the present invention, the dopant is preferably a praseodymium (Pr).

In accordance with another aspect of the present invention, the dopant is preferably an ytterbium (Yb).

In accordance with another aspect of the present invention, the dopant is preferably a praseodymium oxide or an ytterbium oxide.

In accordance with another aspect of the present invention, the dopant preferably has a weight percent less than $10^{-3}$ in the epitaxial layer.

In accordance with another aspect of the present invention, the metal of the metal layer is preferably one selected from a group consisting of nickel, gold, silver, aluminum, titanium, palladium, and platinum.

In accordance with another aspect of the present invention, the epitaxial layer preferably has an inversion layer between the epitaxial layer and the metal layer.

In accordance with another aspect of the present invention, the device is preferably a schottky diode.

In accordance with another aspect of the present invention, the device is preferably a gallium arsenide transistor.

The present invention further provides a method for forming a structure having a schottky barrier junction. The method includes steps of: a) preparing a substrate; b) forming an epitaxial layer having a dopant selected from a group consisting of rare earth element and oxide of rare earth element over the substrate; and c) forming a metal layer over the epitaxial layer to thus form the schottky barrier junction between the metal layer and the epitaxial layer.

In accordance with another aspect of the present invention, the epitaxial layer is preferably formed by a liquid phase epitaxy (LPE) method.

In accordance with another aspect of the present invention, the step b) preferably includes steps of: b1) preparing a solution containing the dopant; and b2) epitaxially growing the epitaxial layer on the substrate with the solution.

In accordance with another aspect of the present invention, the step b1) preferably includes steps of: 11) preparing a solvent of the solution in a container; b12) adding the dopant into the solvent; b 13) preheating the solvent; b14) cooling the solvent into a room temperature; and b15) adding a solute into the solvent.

In accordance with another aspect of the present invention, the dopant preferably has a weight percent less than 1% in the solvent.

In accordance with another aspect of the present invention, the dopant is preferably a praseodymium (Pr).

In accordance with another aspect of the present invention, the dopant is preferably an ytterbium (Yb).

In accordance with another aspect of the present invention, the dopant is preferably a praseodymium oxide or an ytterbium oxide.

In accordance with another aspect of the present invention, the solvent is preferably a gallium.

In accordance with another aspect of the present invention, the solute is preferably a GaAs.

In accordance with another aspect of the present invention, the solvent is preferably an indium.

In accordance with another aspect of the present invention, the solute is preferably an InP.

In accordance with another aspect of the present invention, the solvent is preferably pre-heated at a temperature above 900° C. for 12 hours.

In accordance with another aspect of the present invention, the step b2) preferably includes steps of: b21) heating the solution again to a supersaturated condition, b22) cooling the solution to a saturated temperature of the solution; and b23) immersing the substrate in the solution.

In accordance with another aspect of the present invention, the solute is preferably GaAs, the solvent is Ga, and under the supersaturated condition in the step b21), the solution has a temperature of about 820° C.

In accordance with another aspect of the present invention, in the step b22) the solution is preferably cooled at a temperature gradient of about 1° C. per minute.

In accordance with another aspect of the present invention, the container is preferably a boat having a bin for holding the solution and a slidable substrate holder for holding the substrate.

In accordance with another aspect of the present invention, the boat is preferably made of graphite.

In accordance with another aspect of the present invention, wherein during an executing period of the step b2), the bin is preferably covered by a graphite cover for obtaining a saturated carbon vapor in the bin.

In accordance with another aspect of the present invention, the epitaxial layer is preferably formed with an inversion p-type layer formed on a surface of the epitaxial layer.

In accordance with another aspect of the present invention, the substrate is preferably a heavily doped n-type substrate or a semi-insulating substrate; the epitaxial layer is preferably a n-type epitaxial layer; and the inversion layer is preferably a p-type epitaxial layer.

In accordance with another aspect of the present invention, the boat is preferably made of refractory material.

The present invention may best be understood through the following description with reference to the accompanying drawings, in which:

BRIEF DESCRIPTION OF THE DRAWING

FIG. 3 is a comparison of the measurements of current-voltage and capacity-voltage of schottky diode structures doped with different amounts of rare earth element oxide;

DETAILED DESCRIPTION OF THE PREFERRED EMBODIMENTS

Figure 1A:
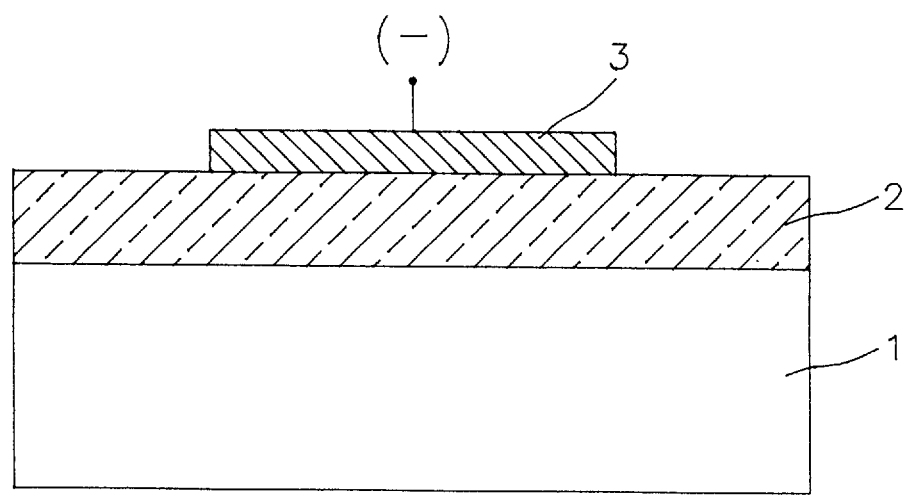
FIG. 1(a) is an illustration of a conventional rectifier having a schottky diode structure.
Figure 1B:
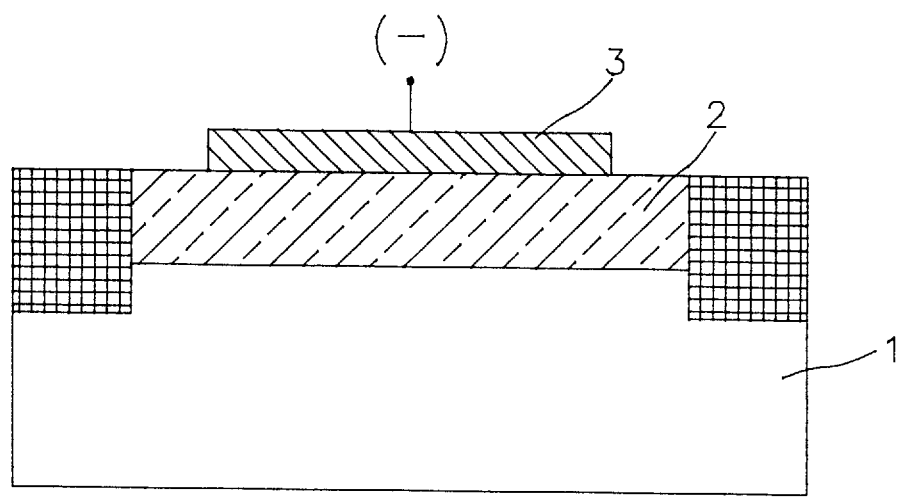
FIG. 1(b) is an illustration of a conventional transistor having a schottky structure.
Figure 2A:
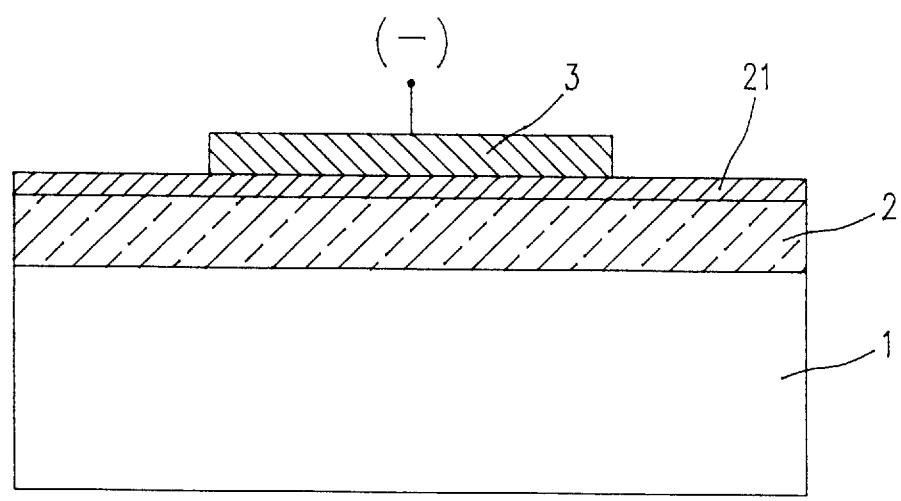
FIG. 2(a) is an illustration of a preferred embodiment of a schottky diode structure according to the present invention.
Figure 2B:
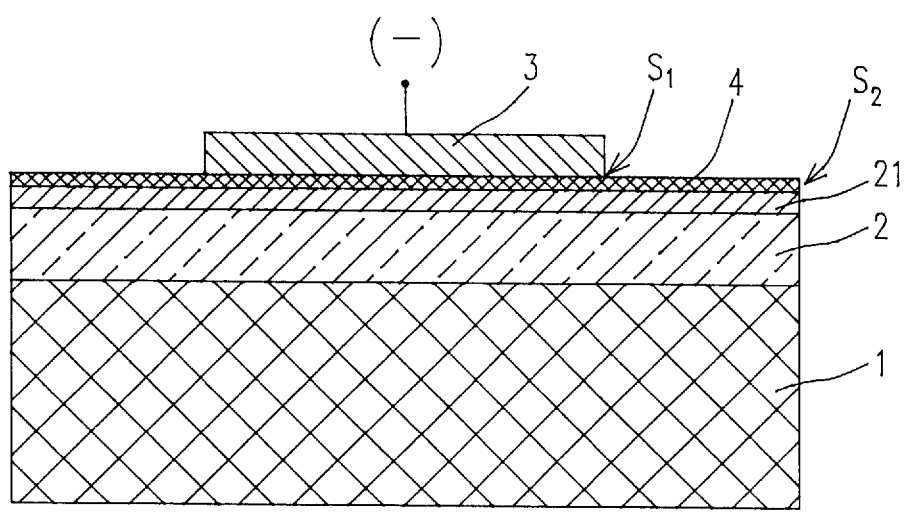
FIG. 2(b) is an illustration of another preferred embodiment of a schottky diode structure according to the present invention.

Referring to FIG. 2(a), which illustrates a preferred embodiment of the present invention, including a substrate 1, an epitaxial layer 2, and a metal layer 3. The rare earth dopant selected from the rare earth elements or their oxides can be either doped in the entire epitaxial layer 2 uniformly, or only doped in a surface layer 21 above the epitaxial layer 2. Preferably, there further exists a very thin inversion layer 4 on the surface of the epitaxial layer 21, as shown in FIG. 2(b). There are two junctions, which are junction S1 between the inversion layer 4 and the metal layer 3, and junction S2 between the epitaxial layer 21 and the inversion layer 4. Because the inversion layer 4 is very thin, the barriers at junctions S1 and S2 will have a combined effect, and thus the schottky barrier of the structure is enhanced.

The substrate 1 may be a doped n-type substrate. Meanwhile, the epitaxial layer 2 and 21 may be GaAs or InP layers. The rare earth element or oxide doped into the epitaxial layer 2 or 21 may be Pr, Yb or $Pr_2O_3$. The dopant concentration in the epitaxial layer 21 is less than $10^{-3}$ weight percent.

On the other hand, the silicon substrate 1 may also be a heavily doped p-type substrate. In such a case, the epitaxial layer 21 is a lightly doped p-type layer. Accordingly, the inversion layer 4 is n-type.

The metal layer 3 may be a Ni, Au, Ag, Al, Ti, Pd or Pt layer.

The epitaxial layer 21 is preferably formed by a liquid phase epitaxy (LPE). The apparatus for executing the LPE process is a high-purity graphite boat having a bin for holding the solution and a graphite slide serving as a substrate holder. There is a graphite cover covering on the opening of the bin in order that the bin is filled with saturated carbon vapor during the LPE process. The saturated carbon vapor will diffuse into the epitaxial layer 21 and thus form the inversion layer 4. The boat may also be made by refractory materials other than graphite, but in such a case the inversion layer 3 will not be formed.

An example of the process of the present invention is described below for illustrating the feature and advantage of the present invention:

a) preparing a substrate having an n-type epitaxial layer;

b) preparing a pre-heated Ga solvent in the bin of the graphite boat;

c) adding a certain amount of $Pr_2O_3$ powder into the bin; and heating the solution with a furnace at a temperature above 900° C. for at least 12 hours;

d) removing the furnace from the boat and cooling the solution to a room temperature;

e) adding a high-purity poly-GaAs as a solute in the solution, wherein the amount of the solute will exactly make the solution be saturated during the epitaxial growth at 800° C.;

f) placing the wafer into the bin which is covered with the graphite cover;

g) heating the solution to a supersaturated temperature 820° C., and then cooling the solution to 800° C. at a temperature gradient of 1° C./min for the epitaxial growth;

h) sputtering the metal layer on the wafer by a union sputter under a pressure no greater than $1 \times 10^{-6}$ torr; and i) annealing the wafer at a temperature of 450° C. to 550° C. for 20 seconds to perform the schottky diode structure.

In the other example, the solute and the solvent of the solution can be replaced by InP and In respectively, and the dopant can be replaced by an Yb element or its oxide with a concentration less than $10^{-3}$ weight percent in the solution.

Furthermore, the process for forming the first epitaxial layer 2 can be replaced by a chemical vapor deposition (CVD) system, and the method for forming the metal layer 3 can be replaced by evaporating or electroplating. The metal layer 3 can be a Ni, Au, Ag, Al, Ti, Pd or Pt layer.

Figure 2C:
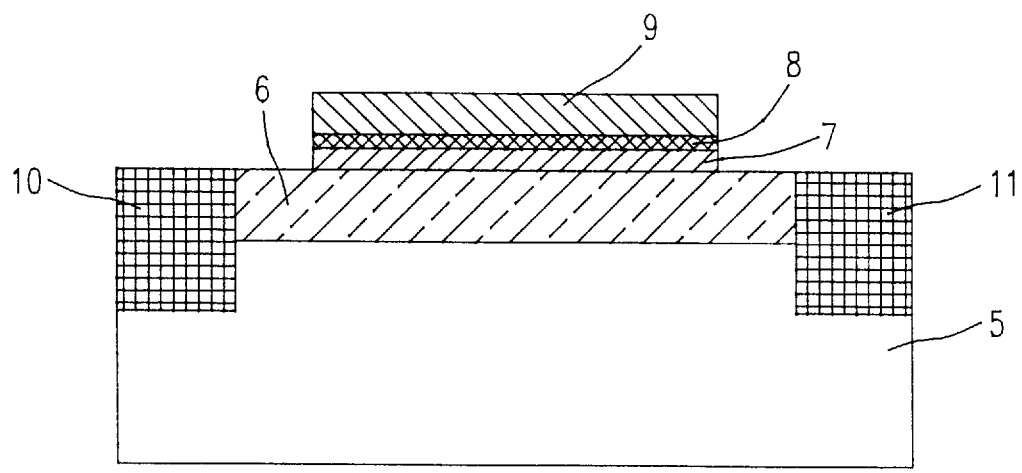
FIG. 2(c) is an illustration of a preferred embodiment of a transistor having the schottky diode structure according to the present invention.
Figure 2D:
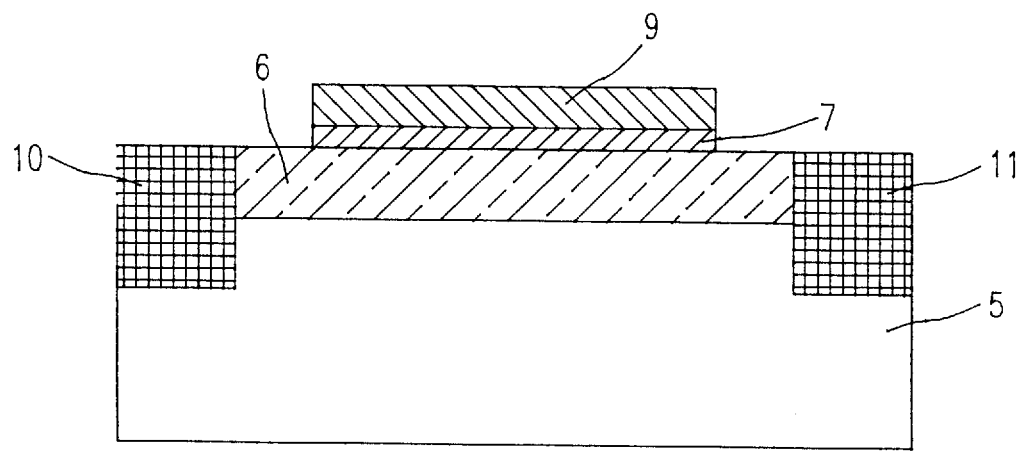
FIG. 2(d) is an illustration of another preferred embodiment of a transistor having the schottky diode structure according to the present invention.

In another preferable embodiment, the schottky barrier structure of the present invention is applied in a transistor. Referring to FIG. 2(c), when serving as a transistor, the substrate 5 is a semi-insulated substrate, and an n-type epitaxial layer 6 which is not doped with rare earth dopants is formed on the substrate 5. The layer 6 can be grown by LPE, CVD or MBE. The epitaxial layer 7 doped with a rare earth dopant is formed between the epitaxial layer 6 and the metal layer 9. Of course, as shown in FIG. 2(d), if the epitaxial 7 is not formed in a graphite boat, the inversion layer 8 will not be formed.

Figure 4:
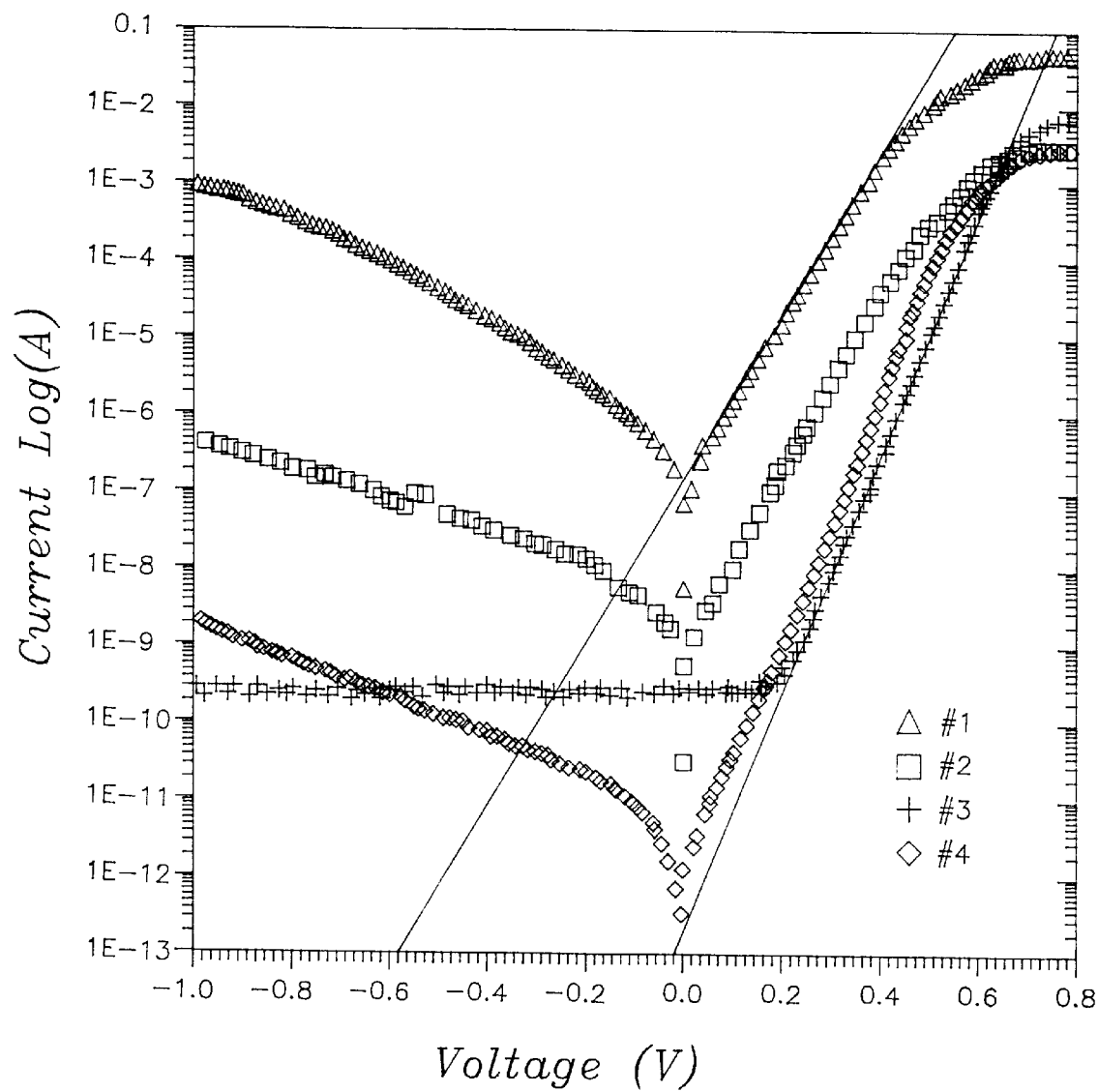
FIG. 4 illustrates current-voltage curves of the preferred embodiments of Ni/GaAs schottky diode structures according to the present invention.

To prove the advantage of the present invention, samples #1, #2, #3 and #4 which have GaAs epitaxial layers respectively, as shown in FIG. 3, are doped with different amounts of $Pr_2O_3$. All the samples are applied with different metal layers 4 such as Ni, Pd, Au and Ag, etc., to form the schottky diode structures respectively, All the schottky diode structures formed accordingly are tested in order to obtain the I–V and C–V characteristics. The schottky barriers $\Phi_{I-V}$ and $\Phi_{C-V}$ are then obtained. Referring to FIG. 3, it is clear that the schottky barriers $\Phi_{I-V}$ and $\Phi_{C-V}$ are raised when a suitable amount $Pr_2O_3$ is doped. FIG. 4 illustrates the results of the I–V measurements of samples #1–#4 all of which are applied with Ni layers respectively. It indicates that when the epitaxial layer is doped with suitable amount of a rare earth element or its oxide, the reverse current is reduced notably, but if the epitaxial layer is over-doped, the lattice structure will be destroyed and the leakage current will be increased again.

Figure 5A:
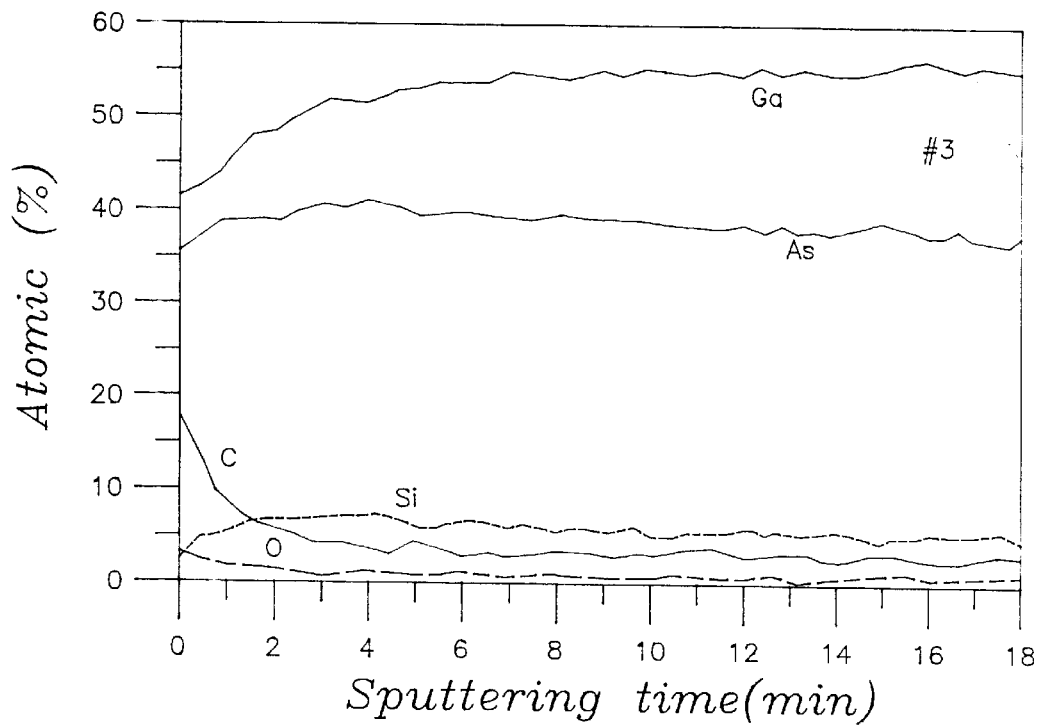
FIGS. 5(a) and 5(b) illustrates the compositions of components of epitaxial layers of the schottky diode structures according to the present invention.
Figure 5B:
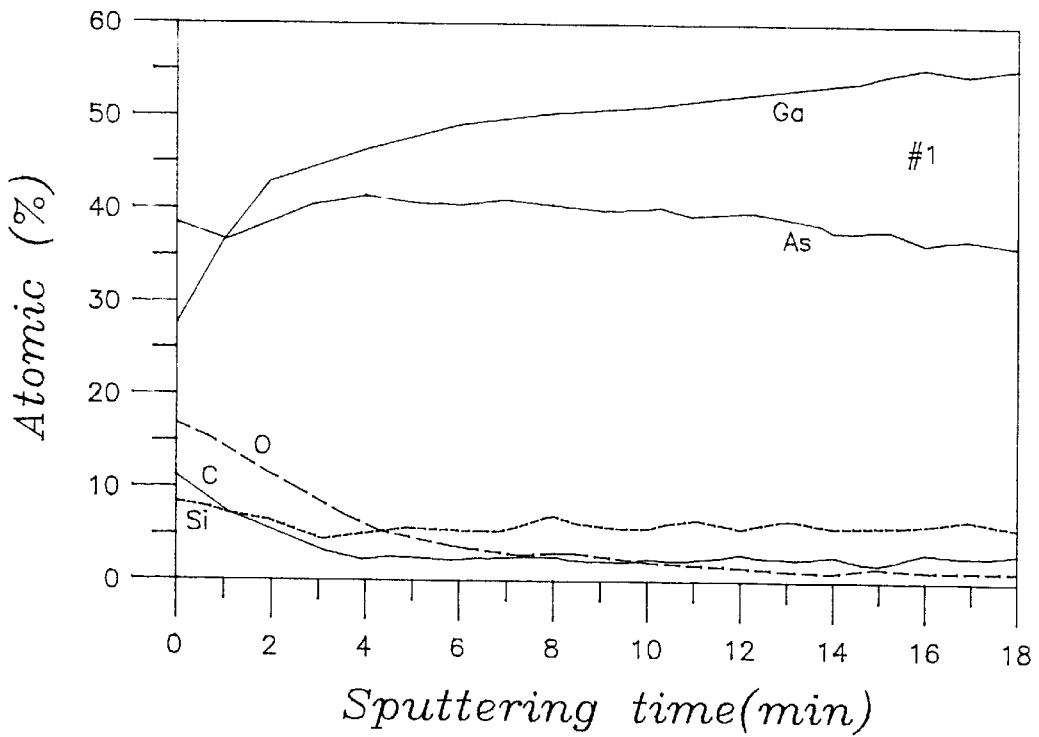

FIGS. 5(a) and 5(b) indicate that when a suitable amount of rare earth element is doped (sample #3), the surface state density will be reduced by the reduction of the oxygen component on the surface of the wafer in comparison to the surface state density of the undoped wafer (sample #1). Furthermore, the carbon concentration on the surface is increased, and thus an inversion layer is formed which will increase the schottky potential barrier of the structure. Of course, if the material of the graphite boat is replaced by another refractory material, the inversion layer will not be formed. Anyway, since the oxygen component in the epitaxial layer is reduced due to the rare earth dopant, the schottky potential barrier of the structure is still improved.

To sum up, the present invention provides a method for producing a schottky diode structure having a high reverse breakdown voltage and a low reverse leakage current. The purpose can be performed only by doping a certain amount of rare earth element or its oxide into the epitaxial layer in stead of modifying the entire process. The method of the present invention is low cost and suitable for mass production, and can be applied in the low leakage rectifier or the high-speed communication field with great benefits.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device having a schottky barrier junction, comprising:

a substrate;

a compound semiconductor epitaxial layer covering said substrate and lightly doped with a dopant selected from a group consisting of a rare earth element and an oxide of a rare earth element; and a metal layer covering said compound semiconductor epitaxial layer and forming said schottky barrier junction with said compound semiconductor epitaxial layer.

2. A device according to claim 1 wherein said substrate is an n-type substrate.

3. A device according to claim 2 wherein said compound semiconductor epitaxial layer is a gallium arsenide (GaAS) layer.

4. A device according to claim 2 wherein said compound semiconductor epitaxial layer is an Indium phosphide (InP) layer.

5. A device according to claim 2 wherein said compound semiconductor epitaxial layer is an n-type epitaxial layer.

6. A device according to claim 5 wherein said dopant is a praseodymium (Pr).

7. A device according to claim 5 wherein said dopant is an ytterbium (Yb).

8. A device according to claim 5 wherein said dopant is a praseodymium oxide.

9. A device according to claim 5 wherein said dopant is a ytterbium oxide.

10. A device according to claim 1 wherein said dopant has a weight percent less than $10^{-3}$ in said compound semiconductor epitaxial layer.

11. A device according to claim 1 wherein the metal of said metal layer is one selected from a group consisting of nickel, gold, silver, aluminum, titanium, palladium, and platinum.

12. A device according to claim 1 wherein said compound semiconductor epitaxial layer has an inversion layer between said compound semiconductor epitaxial layer and said metal layer.

13. A device according to claim 1 wherein said device is a schottky diode.

14. A device according to claim 1 wherein said device is a transistor.

* * * * *